US010974183B2

(12) United States Patent
Fukuoka et al.

(10) Patent No.: US 10,974,183 B2
(45) Date of Patent: Apr. 13, 2021

(54) BREAK FILTER USING A SILICON CARBIDE POROUS BODY AND MANUFACTURING METHOD OF THE BREAK FILTER

(71) Applicant: CoorsTek KK, Tokyo (JP)

(72) Inventors: Seiichi Fukuoka, Hadano (JP); Hiroki Watanabe, Hadano (JP)

(73) Assignee: COORSTEK KK, Tokyo (JP)

( * ) Notice: Subject to any disclaimer, the term of this patent is extended or adjusted under 35 U.S.C. 154(b) by 55 days.

(21) Appl. No.: 16/299,555

(22) Filed: Mar. 12, 2019

(65) Prior Publication Data
US 2019/0282941 A1    Sep. 19, 2019

(30) Foreign Application Priority Data
Mar. 14, 2018 (JP) .............................. JP2018-046604
Nov. 15, 2018 (JP) .............................. JP2018-214985

(51) Int. Cl.
  B01D 39/20 (2006.01)
  B01D 46/00 (2006.01)
  (Continued)

(52) U.S. Cl.
  CPC ..... B01D 39/2075 (2013.01); B01D 46/0001 (2013.01); B01D 46/10 (2013.01);
  (Continued)

(58) Field of Classification Search
  CPC .............. B01D 46/0001; B01D 39/2075; B01D 46/10; B01D 2239/10; C04B 38/0041; C04B 38/0054
  (Continued)

(56) References Cited

U.S. PATENT DOCUMENTS 4,233,187 A * 11/1980 Atwood ................... B01J 23/74
                                                       252/373
4,514,346 A *  4/1985 Luhleich ............... C04B 35/573
                                                       264/29.5
(Continued)

FOREIGN PATENT DOCUMENTS

JP       2009-102191 A       5/2009
JP         5032937 B2        7/2012
(Continued)

OTHER PUBLICATIONS

Office Action (Notification of Reasons for Refusal) dated May 22, 2020, by the Korean Intellectual Property Office in corresponding Korean Patent Application No. 10-2019-0029198 and an English Translation of the Office Action.

Primary Examiner — Tom P Duong
(74) Attorney, Agent, or Firm — Buchanan, Ingersoll & Rooney PC

(57) ABSTRACT

A silicon carbide porous body includes a skeletal structure formed by a plurality of silicon carbide particles bonded to each other, a plurality of pores formed by the skeletal structure, neck parts formed by surface-contacting of adjacent silicon carbide particles, and an average pore size is larger than 3 µm and equal to or smaller than 9 µm, and a porosity ranges from 35% to 55%. A break filter using the silicon carbide porous body enables high performance of collection of particles, prevention of soaring up of particles, and shortening of a restoration time from the depressurized state of the chamber to the atmospheric state.

2 Claims, 5 Drawing Sheets

(51) Int. Cl.
*B01D 46/10* (2006.01)
*C04B 38/00* (2006.01)
*H01L 21/67* (2006.01)

(52) U.S. Cl.
CPC ...... *C04B 38/0041* (2013.01); *C04B 38/0054* (2013.01); *B01D 2239/10* (2013.01); *B01D 2239/1216* (2013.01); *B01D 2275/202* (2013.01); *B01D 2275/406* (2013.01); *H01L 21/67017* (2013.01)

(58) Field of Classification Search
USPC ................................. 55/523; 428/116; 264/42
See application file for complete search history.

(56) References Cited

U.S. PATENT DOCUMENTS

| | | | | |
|---|---|---|---|---|
| 4,777,152 | A * | 10/1988 | Tsukada | B01D 39/2075 |
| | | | | 264/43 |
| 7,427,309 | B2 * | 9/2008 | Ohno | B01D 46/2466 |
| | | | | 55/523 |
| 8,114,184 | B2 * | 2/2012 | Chen | C04B 35/565 |
| | | | | 55/523 |
| 2006/0043652 | A1 | 3/2006 | Saijo et al. | |
| 2006/0222812 | A1 | 10/2006 | Koyama et al. | |
| 2008/0317999 | A1 * | 12/2008 | Patchett | B01D 53/9422 |
| | | | | 428/116 |
| 2012/0079940 | A1 | 4/2012 | Zeller | |
| 2014/0311111 | A1 * | 10/2014 | Wolff | B01J 35/04 |
| | | | | 55/523 |
| 2015/0259254 | A1 * | 9/2015 | Ichikawa | C04B 38/0019 |
| | | | | 428/116 |

FOREIGN PATENT DOCUMENTS

| | | |
|---|---|---|
| JP | 2012530592 A | 12/2012 |
| JP | 2014-062037 A | 4/2014 |
| KR | 10-2007-0112396 A | 11/2007 |
| WO | 2006/003736 A1 | 1/2006 |

* cited by examiner

Fig. 6

Table I

| Solution | Material | Al | Ca | Cr | Cu | Fe | Ni | Ti |
|---|---|---|---|---|---|---|---|---|
| HF 10% | Silicon carbide porous body (OY-15) | <10 | <10 | <5 | <5 | <5 | <5 | 13 |
| | Reference example 1 | <10 | <10 | 68 | 1 | 390 | 6100 | 1 |
| | Reference example 2 | 310 | 43 | <5 | <5 | <5 | <5 | 3 |
| HCl 10% | Silicon carbide porous body (OY-15) | <10 | <10 | <5 | <5 | <5 | <5 | 3 |
| | Reference example 1 | <10 | <10 | <5 | 47 | 12 | 17000 | 2 |
| | Reference example 2 | <10 | <10 | <5 | <5 | <5 | <5 | <1 |
| HBr 10% | Silicon carbide porous body (OY-15) | <10 | <10 | <5 | <5 | <5 | <5 | <1 |
| | Reference example 1 | <10 | <10 | <5 | 79 | <5 | 4700 | <1 |
| | Reference example 2 | 23 | 16 | <5 | <5 | <5 | <5 | <1 |

(Unit: μg/g)

Fig. 7

Table II

| | Average pore size (μm) | Average porosity (%) | Average particle diameter (μm) | Average particle diameter of silicon carbide particles with a diameter less than 1μm (μm) | Amount of silicon carbide fine particles in silicon carbide raw material 100 wt % (wt%) | Sintering temperature (degrees C) |
|---|---|---|---|---|---|---|
| Example 1 | 3.5 | 38 | 1.8 | 0.7 | 20 | 2300 |
| Example 2 | 5 | 40 | 2.5 | 0.7 | 15 | 2300 |
| Example 3 | 9 | 53 | 2.9 | 0.7 | 10 | 2300 |
| Comparative example 1 | 10 | 50 | 5.3 | 0.7 | 10 | 2300 |
| Example 4 | 3 | 52 | 0.5 | 0.7 | 20 | 2300 |
| Example 5 | 3.1 | 40 | 2.5 | 0.7 | 15 | 2200 |
| Example 6 | 9 | 51 | 2.5 | 0.7 | 15 | 2400 |
| Comparative example 2 | 2.5 | 40 | 2.5 | 0.7 | 15 | 2150 |
| Comparative example 3 | 10 | 54 | 2.5 | 0.7 | 15 | 2450 |
| Example 7 | 3.9 | 38 | 2 | 0.5 | 15 | 2300 |
| Comparative example 4 | 10 | 51 | 3.3 | 1.5 | 10 | 2300 |
| Comparative example 5 | 11 | 50 | 3 | 0.7 | 5 | 2300 |
| Comparative example 6 | 1.5 | 43 | 0.4 | 0.3 | 30 | 2300 |

BREAK FILTER USING A SILICON CARBIDE POROUS BODY AND MANUFACTURING METHOD OF THE BREAK FILTER

BACKGROUND OF THE INVENTION

Field of the Invention

The present invention relates to a silicon carbide porous body and a manufacturing method of the silicon carbide porous body, and a break filter (aka, a diffuser) using the silicon carbide porous body.

More specifically, the invention relates to a silicon carbide porous body that is suitable for a break filter to be used in a load lock employed in a semiconductor manufacturing apparatus and to be installed at a gas inlet for restoring a depressurized state in a chamber, for example, to the atmospheric pressure and relates to a manufacturing method of the silicon carbide porous body.

The invention further relates to the break filter using the silicon carbide porous body and a manufacturing method of the break filter.

Description of the Related Art

In semiconductor manufacturing processes, thermal treatment of a semiconductor wafer is performed under a depressurized atmosphere in a processing chamber inside of which is depressurized. After completion of the thermal treatment, the depressurized processing chamber is restored to the atmospheric pressure and then the wafer is extracted.

Such a semiconductor processing apparatus is usually provided with a gas inlet and a gas outlet to make the processing chamber and the outside be in the same atmosphere at a time wafers to be processed are brought into the chamber and then processed wafers are extracted from the chamber to the outside. The chamber is configured to be pressure-reduced by evacuating atmospheric gas through the gas outlet, and to be released from the depressurized state by supplying gas through the gas inlet.

An outline configuration of the semiconductor processing apparatus will be explained with reference to FIG. 3.

As shown in FIG. 3, a semiconductor processing apparatus 50 includes a gas inlet device 60 through which gas is supplied to release a depressurized state. When the gas inlet device 60 (a break filter) is used in the gas inlet, the gas inlet device 60 can relieve instantaneous pressure fluctuation when an open/close valve 51 is opened and have an effect of preventing particles in the apparatus from soaring up. Incase of evacuation of the apparatus, as a fine-adjusting valve 53 is provided in parallel to an open/close valve 52 for evacuation, slow evacuation is achieved by operating the fine-adjusting valve 53 at a start of evacuation. A reference sign W in the drawing denotes a wafer to be processed.

The gas inlet device 60 (break filter) thus used has an assembly configuration where a cylindrical filter element 61 is sandwiched by a pair of metal spacers 62a and 62b with gaskets 63, 63 made of polytetrafluoroethylene (PTFE) interposed. Provided is a gas pipe 65 that is a metal hollow pipe having a large number of gas permeable holes 64 drilled on its circumferential surface, and the gas pipe penetrates the spacer 62b and the filter element 61.

A procedure for releasing the reduced pressure state in the chamber using the gas inlet device (break filter) 60 is as follows: at first the open/close valve 51 is opened to introduce a gas through the gas pipe on a spacer 62b side, then the gas is introduced to the processing chamber through the gas permeable holes 64 and the filter element 61, hence the filter element 61 works as resistance so that a flow rate is reduced and the depressurized state is gradually released. As describe above, a flow speed of in-coming gas to the processing chamber is reduced and as a result soaring up of particles in the chamber and dew condensation are prevented.

As materials for a filter element 61 in the gas introduction device (break filter) 60, a filter medium is typically composed of metal particles of nickel that is disclosed in JP-T-2012-530592 (PL1), or synthetic resin such as PTFE, or ceramics such as alumina or silica. In addition, Japanese Patent No. 5032937 (PL2) discloses a break filter in which a silicon carbide porous body is used as a filter medium.

It is, however, an issue that gas to be introduced into the load lock chamber, such as a corrosive gas, may progresses corrosion of the material of the filter element 61 when metal particles such as nickel is used as the filter medium. In case of alumina used as the filter medium, though alumina itself is resistant to the gas, additives as an assistant or unavoidable impurities may cause to deteriorate corrosion resistance. When silica ceramics is used as the filter medium, it is less corrosion-resistant to fluorine-based gases. In addition, in case of PTFE as the filter medium, it is an issue that strength and heat resistance is not satisfactory.

To solve a problem such as corrosion resistance or heat resistance, JP No. 5032937 discloses an idea of using a silicon carbide porous body as a filter medium. In a break filter disclosed in JP No. 5032937, however, performance of particle collection or prevention of soaring up of particles is not satisfactory due to large size of pores and large porosity. For solving the problem above reduction of the pore size in a silicon carbide porous body causes porosity to be smaller and improves the performance of particle collection or prevention of soaring up of particles, but this brings about another problem of taking longer time to restore the chamber to the atmospheric pressure because of a larger pressure loss.

Supposing usage of a silicon carbide porous body that is excellent in corrosion and heat resistance as a filter medium for the break filter, the present inventor has arrived to the invention after an intensive effort for solving the problem disclosed in the Japanese Patent No. 5032937 (PL2).

SUMMARY OF THE INVENTION

It is an object of the invention to provide a silicon carbide porous body suitable for a break filter to be placed at a gas inlet to be used for restoring a depressurized chamber to the atmospheric pressure and a method of the silicon carbide porous body, and to provide a break filter that enables to ensure performance of collecting particles and preventing particles from soaring up and to restore the inside of the chamber to the atmospheric pressure within a short time, and a manufacturing method of the break filter. The silicon carbide porous body according to the present invention has a skeletal structure in which a plurality of silicon carbide particles are bonded to each other and the structure forms a plurality of included pores. Neck parts are formed by the adjacent silicon carbide particles contacting by surface and an average pore size ranges from 3 μm to 9 μm, and a porosity ranges from 35% to 55%.

Use of thus structured silicon carbide porous body to the break filter to be placed at the gas inlet of a semiconductor processing apparatus achieves excellent performance of collecting particles and preventing particles from soaring up, while assuring a sufficient gas flow rate. Having a neck structure enables to provide sufficient strength to the porous body.

A manufacturing method of the silicon carbide porous body to achieve the above object according to the present invention is a method of manufacturing the silicon carbide porous body for a break filter to be placed at the gas inlet of the semiconductor processing apparatus; the method includes processes of mixing silicon carbide particles having average diameters ranging from 0.5 μm to 5 μm added with an organic binder, forming, and then sintering under a non-oxidizing atmosphere and the sintering temperature ranges from 2200° C. to 2400° C.

Silicon carbide particles having average diameters ranging from 0.5 μm to 5 μm is a mixture of silicon carbide particles having a diameter less than 1 μm and silicon carbide particles having a diameter equal to or larger than 1 μm and an amount of the silicon carbide particles having a diameter less than 1 μm preferably ranges from 10 wt % to 20 wt % of a total amount of the silicon carbide particles.

The silicon carbide porous body according to the present invention can be obtained by the manufacturing with the above method.

After the process of mixing silicon carbide particles having average diameters ranging from 0.5 μm to 5 μm added with an organic binder, forming, and sintering, further sintering processing is preferably performed under an oxidizing atmosphere at a temperature ranging from 1000° C. to 1300° C.

With the oxidation heat treatment at the temperature range above, oxide films are formed on the silicon carbide, cracks to possibly become defects are filled and repaired; as a result strength as a porous body can become approximately doubled compared to non-oxidized ones.

There is provided a method of manufacturing a break filter that includes a filter element made by forming the silicon carbide porous body to a disk shape, a casing made of passivation-treated stainless steel that covers a first side of the filter element and is provided with a gas inlet on the first side of the filter element, and a ring made of passivation-treated stainless steel that supports a periphery of a second side of the filter element and is fitted in the casing; the method includes a step of cooling the ring, a step of housing the filter element in the cooled ring and a step of integrating the ring having the filter element therein into the casing by cool-fitting.

The present invention provides a silicon carbide porous body used in a break filter to be placed at a gas inlet to be used for restoring a depressurized chamber to the atmospheric pressure and a method of the silicon carbide porous body, and provides a break filter that enables to ensure performance of collecting particles and preventing particles from soaring up and to restore the inside of the chamber to the atmospheric pressure within a short time, and a manufacturing method of the break filter.

BRIEF DESCRIPTION OF THE DRAWINGS

FIG. 6 is Table I showing the results of Experiment 1; and

FIG. 7 is Table II showing the conditions of Experiment 2.

DESCRIPTION OF THE PREFERRED EMBODIMENTS

A silicon carbide porous body and a manufacturing method thereof according to the present invention will be explained with reference to the drawings.

Figure 1:
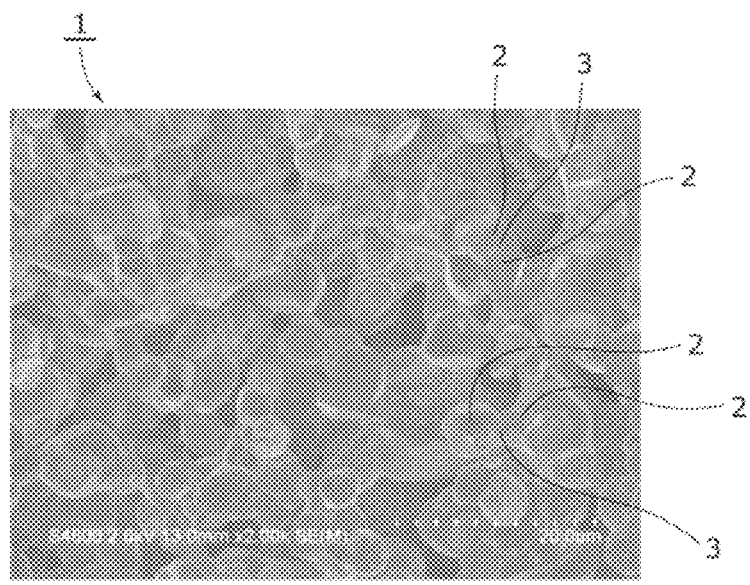
FIG. 1 is a scanning electron microscope (SEM) image showing a skeletal structure of a silicon carbide porous body of a first embodiment according to the present invention.

FIG. 1 is a scanning electron microscope (SEM) image showing a skeletal structure of the silicon carbide porous body of a first embodiment according to the present invention.

The silicon carbide porous body 1 shown in FIG. 1 is composed of silicon carbide (SiC), and a plurality of silicon carbide particles are bonded to construct a skeletal structure and a large number of pores are formed between the skeletons. An average pore size of the silicon carbide porous body 1 ranges from 3 μm to 9 μm, preferably ranges from 3 μm to 6 μm, and porosity ranges from 35% to 55%.

An average pore size is measured with a mercury penetration method, and an average particle diameter is measured with an SEM image analysis method.

As shown in the image of FIG. 1, adjacent silicon carbide particles are contacting by surface, forming a neck part 3 at the contact portion. The formation of the neck part 3 enables sufficient strength for filter medium use.

With an average pore size equal to or less than 3 μm, pressure loss increases and gas supply decreases; this causes time for restoring to the atmospheric pressure much longer. With the pore size more than 9 μm, performance of collecting particles and preventing particles soaring up deteriorates; this causes to give rise to a problem of decrease of wafer manufacturing yields.

With porosity equal to or less than 35%, gas supply decreases; this causes time to restoring to the atmospheric pressure much longer. With the pore size more than 55%, performance of preventing particles soaring up deteriorates; this causes to give rise to a problem of decrease of wafer manufacturing yields.

Using thus manufactured silicon carbide porous body as a break filter, it is possible to ensure a sufficient gas flow, collect particles, and sufficiently prevent particles from soaring up.

The silicon carbide porous body 1 is manufactured by mixing silicon carbide particles having average diameters ranging from 0.5 μm to 5 μm added with an organic binder, forming, and sintering. Sintering is performed at a temperature ranging from 2200° C. to 2400° C. for 2 hours, for example. A basis that silicon carbide particles are to have the average diameters ranging from 0.5 μm to 5 μm is that with an average diameter equal to or less than 0.5 μm, porosity decreases and gas supply decreases, which causes time for restoring to the atmospheric pressure much longer, and that with the diameter more than 5 μm, pore size increases and performance of collecting particles and preventing particles soaring up deteriorates.

A sintered body can be obtained when the silicon carbide particles are sintered at a temperature ranging from 2000° C. to 2200° C. In that case, however, growth of particles is not enough and silicon carbide fine particles remain, it may be a dust source and an amount of gas supply reduces due to a smaller pore size. Further, the neck part does not grow sufficiently and the strength is not satisfactory.

When the sintering temperature is set to be in a range of 2200° C. to 2400° C., the silicon carbide fine particles disappear by evaporating or at the neck part precipitating and aggregating; the strength enhances resultantly.

A higher sintering temperature than 2400° C. accelerates particle growth and causes pore size to become larger. This causes performance of collecting particles and preventing particle soaring up to deteriorate and the strength to decrease.

Because the silicon carbide particles having average diameters ranging from 0.5 μm to 5 μm is a mixture of silicon carbide particles having a diameter less than 1 μm and silicon carbide particles having a diameter equal to or larger than 1 μm and an amount of the silicon carbide particles having a diameter less than 1 μm preferably ranges from 10 wt % to 20 wt % of a total amount of the silicon carbide particles, a ratio of sizes of the whole silicon carbide particles can be controlled properly and this enables to create targeted pore sizes and skeletal structures.

According to the first embodiment of the present invention, silicon carbide porous body 1 having the average pore size ranging 3 μm to 9 μm, preferably ranging 3 μm to 6 μm, and the porosity ranging 35% to 55% enables to ensure sufficient gas flow and to obtain excellent performance of collecting particles and preventing particles soaring up.

Next, a second embodiment according to the present invention will be explained. In the second embodiment, the silicon carbide porous body 1 obtained in the first embodiment is further oxidized by heating.

Figure 2:
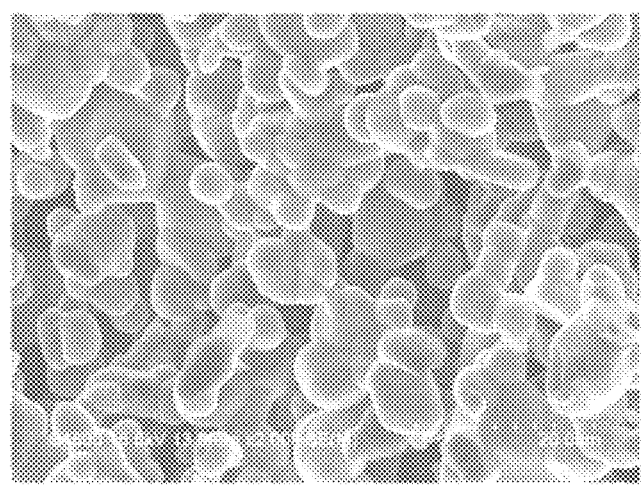
FIG. 2 is a SEM image showing a skeletal structure of a silicon carbide porous body of a second embodiment according to the present invention.
Figure 3:
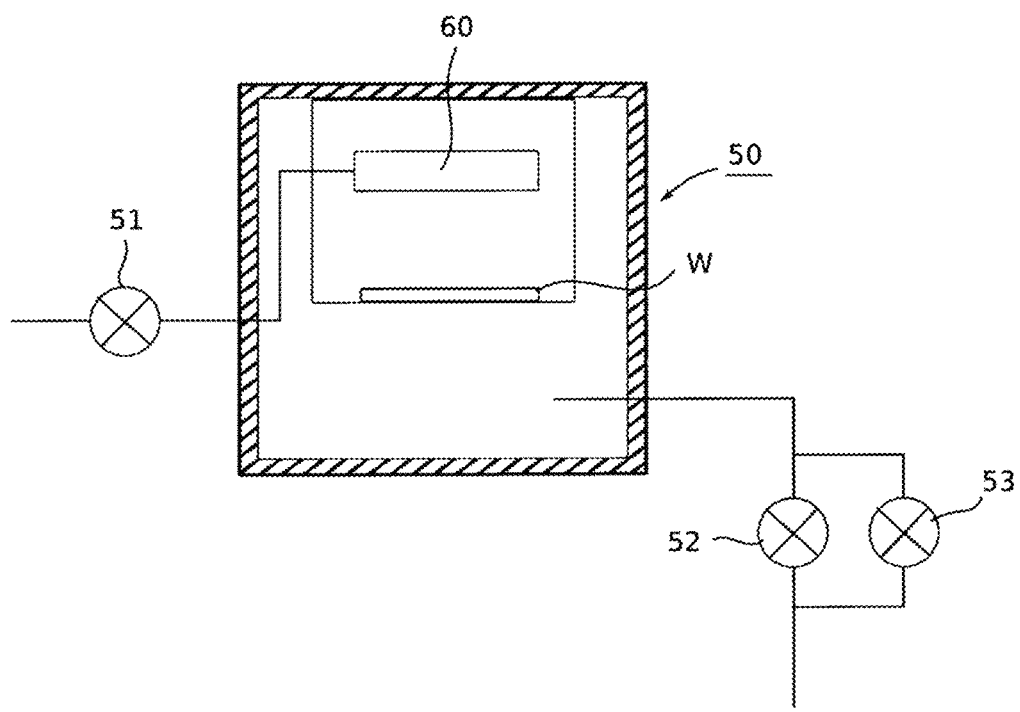
FIG. 3 is a block diagram showing an outline structure of a semiconductor processing apparatus.
Figure 4:
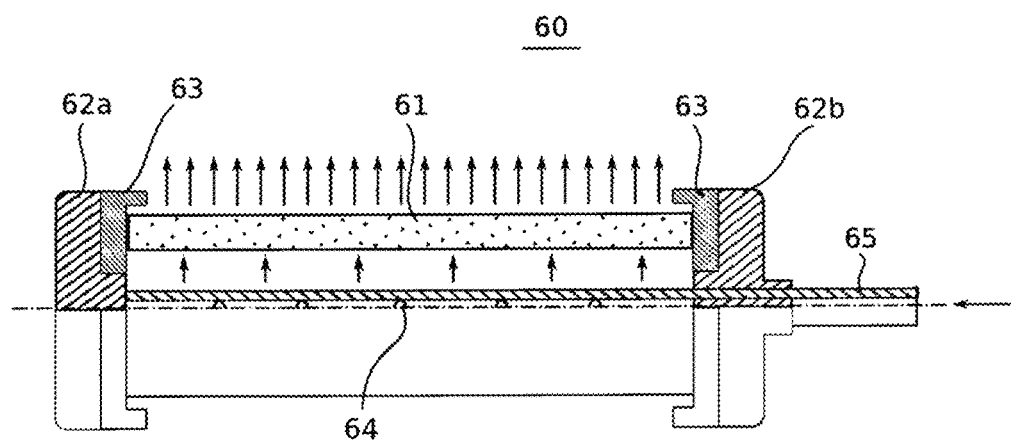
FIG. 4 is a block diagram showing an outline structure of a gas inlet device (a break filter)

That is, the silicon carbide porous body 1 obtained is heat treated at a temperature ranging from 1000° C. to 1300° C. for 2 hours, for example. FIG. 2 is an SEM image of the silicon carbide porous body 10 obtained by oxidation treatment, showing a skeletal structure of the silicon carbide porous body obtained in the second embodiment.

By the oxidation treatment the strength as a porous body is almost doubled. This is speculated that the heat treatment forms an oxide film, preferably having a thickness of 50 nm to 200 nm, on a surface of SiC and cracks possible to be defects are filled and repaired.

Since this strengthening by the heat treatment enables to increase a supply gas pressure and an amount of gas flow, a restoration time to the atmospheric pressure in the depressurized chamber can be reduced.

In the heat treatment for strengthening, a heating temperature lower than 1000° C. causes oxidation film thickness to be thinner and the effect of strengthening to be insufficient. While the temperature higher than 1300° C. causes the oxidation film thickness to be thicker but effects of filling to defects and repairing to become saturated, and further effects of strengthening is not observed.

Peeling of too-thickened oxidation films from SiC surfaces due to a difference of thermal expansion coefficients is subject to be a source of dust.

According to the second embodiment of the present invention, the silicon carbide porous body 1 having the average pore size ranging from 3 μm to 9 μm, preferably ranging from 3 μm to 6 μm, and the porosity ranging from 35% to 55% can be highly strengthened by applying oxidation heat treatment at a predetermined temperature; this can provide a silicon carbide porous body 1 that enables to obtain excellent performance of collecting particles and preventing particles soaring up, and to reduce a time to restore to the atmospheric pressure from a depressurized state in the chamber.

A third embodiment of the manufacturing method, according to the present invention, of the break filter will be explained with reference to FIG. 5.

A break filter 100 includes a disk-shaped filter element 102 made of silicon carbide (SiC), a casing 103 made of stainless steel for supporting the filter element 102 (hereinafter simply as a stainless casing), and an upper side gasket 104 and a lower side gasket 105 as sealing members, both made of polytetrafluoroethylene (PTFE) or fluororubber, for example, being provided respectively at an upper and lower end of a periphery of the filter element 102.

The filter further includes a ring 106 made of stainless steel (hereinafter simply as a stainless ring) for fixing the filter element 102 to the stainless casing 103.

Figure 5:
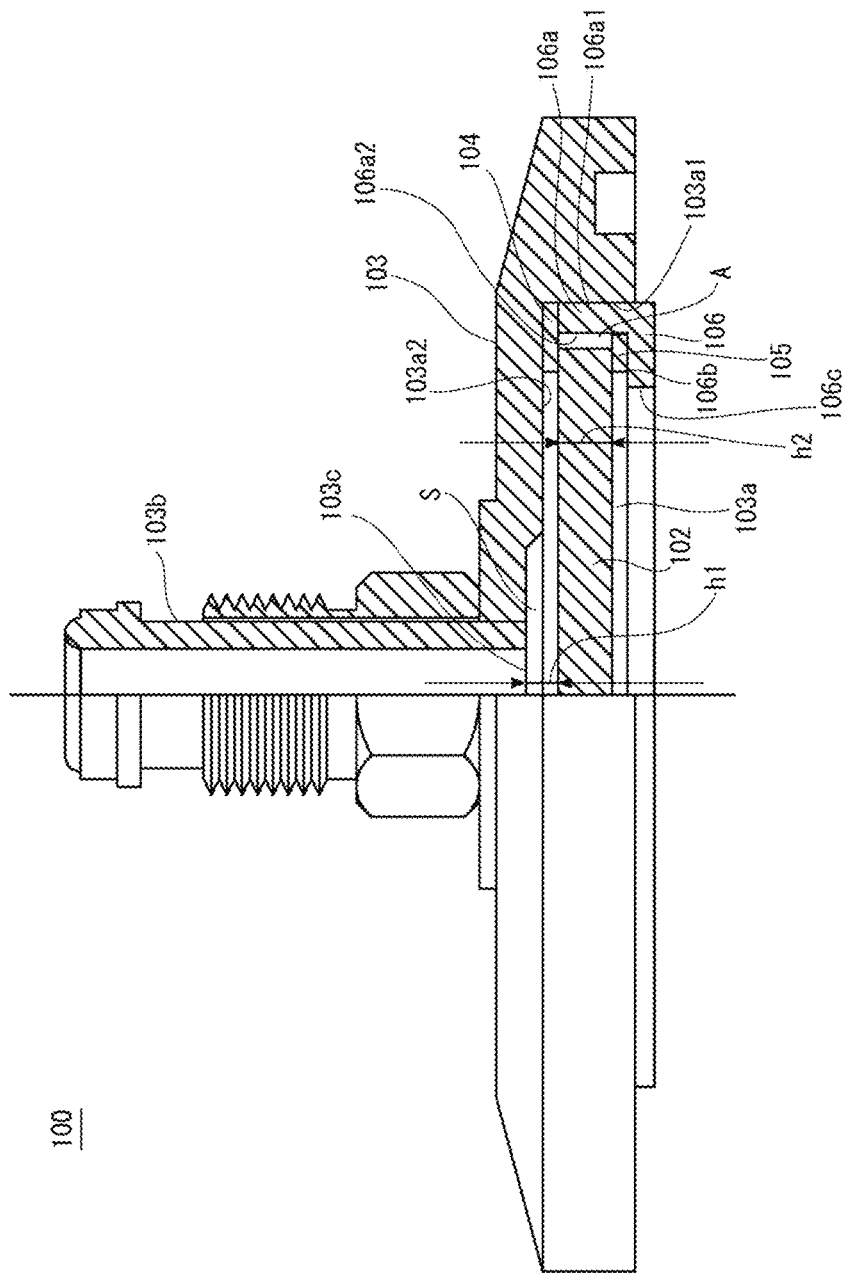
FIG. 5 is a cross-sectional view of an example of a break filter according to the present invention.

As shown in FIG. 5, the stainless casing 103 is a filter holder made of stainless steel and has a housing space 103a which is largely opened downward and houses the filter element 102.

A gas inlet 103c is provided at an upper central area of the housing space 103a and the gas inlet 103c communicates with an inside of a pipe-shaped connecting portion 103b for connecting to a chamber system (not shown).

A surface of the stainless casing 103 is a passivated surface by a passivation treatment, to which improvement in corrosion resistance is achieved.

As shown in FIG. 5, the stainless ring 106 is a circular ring-shaped body having a cross section of an L shape. An outer surface 106a1 of an outer wall 106a of the stainless ring 106 is formed in size to engage with an inner face 103a1 of the housing space 103a of the stainless casing 103.

A mounting portion 106b where the filter element is mounted extends horizontally toward a center from the outer wall 106a of the stainless ring 106. A penetrating hole 106c is bored at a central portion of the mounting portion 106b, and one surface of the filter element 102 is made exposed through the penetrating hole 106c.

A surface of the stainless ring 106 is a passivated surface by a passivation treatment, to which improvement in corrosion resistance is achieved.

The upper gasket 104 is made of PTFE or fluororubber, for example, and formed into a ring shape as shown in FIG. 5.

As shown in FIG. 5, the upper gasket 104 is disposed between a periphery of an upper surface of the filter element 102, an upper face of the stainless ring 106, and a bottom face 103a2 of the housing space 103a of the stainless casing 103, thereby preventing gas inflow into a gap A formed by an inner surface 106a2 of the an outer wall 106a of the stainless ring 106 and an outer surface of the filter element 102.

As shown in FIG. 5, the lower gasket 105 is made of PTFE or fluororubber, for example, and formed to be a ring shape.

As shown in FIG. 5, the lower gasket 105 is disposed between a periphery of a lower surface of the filter element 102 and the mounting portion 106b of the stainless ring 106, thereby preventing gas inflow through the gap A formed by the inner surface 106a2 of the outer wall 106a of the stainless ring 106 and the outer surface of the filter element 102.

Housing of the filter element 102 into the stainless casing 103 is performed as follows: the stainless ring 106 is cooled in liquid nitrogen at −196° C. and made contracted; the filter element 102 is mounted on the mounting portion 106b of the stainless ring 106 via the lower gasket 105; and the stainless ring 106 on which the filter element 102 is mounted is equipped in the housing space 103a of the stainless casing 103 via the upper gasket 104.

Then, when a temperature of the stainless ring 106 becomes to an ambient temperature, the stainless ring returns to an original shape and size and the stainless ring fits to the stainless casing 103 (so-called expansion fit). That is, an outer diameter of the stainless ring expands 106 to cause the outer surface 106a1 of the outer wall 106a to press outward the inner face 103a1 of the stainless casing 103, whereby the stainless ring 106 is fitted to the stainless casing 103.

As described above, the third embodiment according to the present invention enables to firmly hold the filter element in a thin small casing.

EXAMPLES

A silicon carbide porous body according to the present invention will be further explained on the basis of examples. In the Examples, effects of anti-corrosion characteristics of the silicon carbide porous body, and that of break filter characteristics to be explained below were verified by manufacturing the silicon carbide porous bodies having configurations shown in the embodiments. The Examples show a preferable example and this does not restrict the scope of invention. A shape of a filter element, for example, may be in any one of shapes of cylinders, plates, or others. A holding method of the filter element to a casing is not limited to expansion fit, but may be any one of shrink fit, brazing, use of adhesives or other methods.

Experiment 1

Corrosion resistance of a silicon carbide porous body as a material for a filter element used in the present invention was verified in Experiment 1.

As a silicon carbide porous body to be verified in the Experiment 1, OY-15 (supplied by YAKUSHIMA DENKO CO., LTD.) was used as a sample.

One of the samples of the silicon carbide porous body was immersed in a 10% hydrofluoric acid (HF) solution at 22° C. for 15 hours and a component elution amount per 1 g of the sample (µg/g) was measured.

Similarly another sample of the silicon carbide porous body was immersed in a 10% hydrochloric acid (HCl) solution at 22° C. for 15 hours and a component elution amount per 1 g of the sample (µg/g) was measured.

Further another sample of the silicon carbide porous body was immersed in a 10% hydrobromic acid (HBr) solution at 22° C. for 15 hours and a component elution amount per 1 g of the sample (µg/g) was measured.

As a reference example 1, a sample of a nickel (Ni) filter element supplied by Company A was immersed in a 10% hydrofluoric acid (HF) solution at 22° C. for 15 hours and a component elusion amount per 1 g of the sample (µg/g) was measured.

Similarly, another sample of a nickel (Ni) filter element supplied by Company A was immersed in a 10% hydrochloric acid (HCl) solution at 22° C. for 15 hours and a component elusion amount per 1 g of the sample (µg/g) was measured.

Further, another sample of a nickel (Ni) filter element supplied by Company A was immersed in a 10% hydrobromic acid (HBr) solution at 22° C. for 15 hours and a component elusion amount per 1 g of the sample (µg/g) was measured.

As a reference example 2, a sample of an alumina porous body was immersed in a 10% hydrofluoric acid (HF) solution at 22° C. for 15 hours and a component elusion amount per 1 g of the sample (µg/g) was measured.

Similarly another sample of the alumina porous body was immersed in a 10% hydrochloric acid (HCl) solution at 22° C. for 15 hours and a component elution amount per 1 g of the sample (µg/g) was measured.

Further another sample of the alumina porous body was immersed in a 10% hydrobromic acid (HBr) solution at 22° C. for 15 hours and a component elution amount per 1 g of the sample (µg/g) was measured.

Results of the Experiment 1 are shown in Table I of FIG. 6. From the results above, it is found that elution of Fe, Cr, Cu and Ti are observed from the Ni filter element of the Company A (reference example 1) and Ca and Ti are observed from the alumina porous body (reference example 2).

On the contrary, only a minute amount of Ti elution from the silicon carbide porous body was observed and high corrosion resistance is confirmed.

In Experiment 2, characteristics of a break filter using a silicon carbide porous body according to the present invention (as described in Experiment 1) were verified.

2 parts by weight of polyvinyl alcohol (PVA) added as a binder material was added to 100 parts by weight of silicon carbide raw material having an average diameter within a predetermined range and mixed with water. The mixture was dried and crushed, and a compact obtained by uniaxially press-forming at 700 kg/cm$^2$ with a metal mold was sintered for 2 hours at a temperature shown in Table II of FIG. 7. Thus obtained porous bodies have different in an average pore size and average porosity depending on conditions of particle sizes and heating temperatures.

A plurality of kinds of samples were selected from the porous bodies thus obtained and formed into filters shown in FIG. 5 having a diameter of 48 mm and a thickness of 5 mm (See examples 1 to 7, and comparative examples 1 to 6)

Table II shows conditions of Experiment 2.

Table III shows performance characteristics of break filters with porous bodies of examples 1 to 7 and comparative examples 1 to 6.

In Table III, a gas flow (L/min) denotes a gas amount per minute passing a porous body having a diameter of 48 mm and a thickness of 5 mm when N$_2$ gas is supplied to flow at a supply pressure of 0.2 MPa.

Number of dust particles means the number of dust particles generated from the porous body having a diameter of 48 mm and a thickness of 5 mm when air is supplied to flow.

Particle collection performance (PCP) is defined by a relation that 1 minus a ratio of the number of particles passing through the porous body having a diameter of 48 mm and a thickness of 5 mm to that of in-coming particles when a gas containing a certain number of 30 nm diameter particles; the particle collection performance is obtained by using the equation below, PCP=(1−the number of particles passing through the porous body/the number of in-coming particles)×100(%).

In Particle collection performance data, N denotes "9" and a figure preceding N shows the number of successive nines. (Example: 3N=99.9%)

Performance of prevention of soaring up of particles denotes the number of quartz particles soared up during restoration of a depressurized state to the normal state when quartz powder having a diameter ranging from 30 µm to 60 µm are scattered in a chamber.

TABLE III

| | Gas flow rate (L/min) | Number of dust particles (number) | Collection performance of particles (%) | Prevention performanc of particle soaring up (number) |
|---|---|---|---|---|
| Example 1 | 120 | 1 | 9N | 0 |
| Example 2 | 210 | 1 | 8N | 2 |
| Example 3 | 315 | 6 | 8N | 3 |
| Example 4 | 180 | 2 | 9N | 1 |
| Example 5 | 110 | 3 | 9N | 0 |
| Example 6 | 330 | 2 | 8N | 11 |
| Example 7 | 220 | 4 | 9N | 1 |
| Comparative example 1 | 350 | 5 | 5N | 112 |
| Comparative example 2 | 90 | 15 | 7N | 3 |
| Comparative example 3 | 420 | 3 | 4N | 658 |
| Comparative example 4 | 550 | 22 | 3N | 1,050 |
| Comparative example 5 | 325 | 18 | 5N | 250 |
| Comparative example 6 | 65 | 25 | 8N | 1 |

From the results shown in Table III, in examples 1 to 7 high performance of particle collection and prevention of soaring up of particles with ensuring a sufficient gas flow is confirmed. In addition, it is confirmed that at that time the average pore size is more than 3 μm and not more than 9 μm and the porosity ranges from 35% to 55%.

A silicon carbide raw material having an average particle size ranging from 0.5 μm to 5 μm to which an organic binder having a diameter less than 1 μm was added was mixed, formed and then sintered at a temperature ranging from 2200° C. to 2400° C. It is also confirmed that this gives a silicon carbide porous body having the average pore size and the average porosity.

Experiment 3

In Experiment 3, performance characteristics of a filter using the silicon carbide porous body according to the present invention (Example 1) that was further oxidized by heating to form an oxidation film were verified.

In the Experiment 3 a silicon carbide porous body was formed based on the Example 1 to have an average pore size of 5 μm and an average porosity of 40%.

A filter element having a diameter of 48 mm and a thickness of 5 mm shown in FIG. 5 was formed using the obtained porous body that was subject to oxidation heat treatment for 2 hours under conditions of heating temperatures, and the characteristics were verified.

The conditions of Experiment 3 and the results are shown in Table IV.

The reason why the gas flow in Table IV is larger than those in Table III is that gas can be flown at a higher pressure owing to the increase of strength.

Experiment 4

<Manufacturing of a Filter Element>

A silicon carbide raw material having an average diameter of 3 μm and 0.7 μm are mixed at a ratio of 85:15, 2 parts by weight of polyvinyl alcohol as a binder was added to 100 parts by weight of the silicon carbide raw material and mixed with water.

The mixture was dried and crushed, and a compact obtained by uniaxially press-forming at 700 kg/cm$^2$ with a metal mold was sintered at a temperature of 2300° C. for 2 hours. The obtained sintered compact is a porous body having a porosity of 52%, and is formed to a disk-shaped filter element having a diameter of 50 mm and thickness of 5 mm.

<Manufacturing of a Stainless Casing and a Stainless Ring>

A stainless casing and a stainless ring having a shape shown in FIG. 5 were press-formed with a metal mold, and the surface of them were passivated by an electropolishing technique.

Specifically the treatment was performed under the following conditions.

The electrolytic polishing treatment to form a passive film was performed by immersing a stainless steel casing and a stainless steel ring in a sulfuric acid-based electrolytic solution with applying a voltage using a commercially available electrolytic polishing apparatus.

TABLE IV

| | Heating Temperature (° C.) | Bending strength (MPa) | Supplyable gas pressure (MPa) | Gas flow rate (L/min) | Number of generated particles (number) | Particle collection (%) | Prevention of soaring-up particles (number) |
|---|---|---|---|---|---|---|---|
| Example 8 | 1000 | 150 | 0.8 | 450 | 0 | 9N | 0 |
| Example 9 | 1200 | 210 | 0.9 | 550 | 0 | 9N | 0 |
| Example 10 | 1300 | 230 | 0.9 | 550 | 1 | 9N | 1 |
| Comparative example 7 | 950 | 95 | 0.5 | 250 | 0 | 8N | 1 |
| Comparative example 8 | 1350 | 235 | 0.5 | 250 | 35 | 8N | 2 |

From the results shown in Table IV, it is confirmed that heat-treating at a temperature ranging from 1000° C. to 1300° C. to the porous body obtained in the Example 1 can give further increased strength of the filter with maintaining high performance of collecting particles and preventing from soaring up of particles.

<Assembly>

A filter element is mounted via a gasket on a stainless ring cooled to −196° C. in liquid nitrogen. Further another gasket is mounted on an upper periphery of the filter element and a stainless ring, and the stainless ring is fitted in a housing space by cool-fitting and returned to the normal temperature.

In the process of assembly, a space of 1 mm in height which corresponds to 20V of the thickness of the filter between the stainless casing and the upper surface of the filter element is formed, and a space of 2.5 mm in height which corresponds to 50% of the thickness of the filter between the stainless casing and the upper surface of the filter element at an area with a diameter of 20 mm in the vicinity of gas inlet is formed.

<Verification>

After mounting an assembled break filter to a chamber having a volume of 25 L, evacuating inside the chamber down to 1 kPa, a valve was opened to introduce gas through the break filter and the number of particles soared up was counted. The number was counted with gas being supplied in a situation where particles having a diameter ranging from 30 μm to 50 μm were scattered on a bottom surface of the chamber. The counted number of soaring up particles was 12; high performance of preventing from soaring up of particles is confirmed.

In addition, a break filter was attached to an etching apparatus and exposed to an etching gas for 24 hours, which corresponds 20,000 times usage of the etching apparatus. After the use, the filter was detached and a state of the break filter was observed with an SEM and no changes of the filter element was found.

From the experimental results of examples, it is confirmed that use of the silicon carbide porous body according to the present invention enables high performance of collection of particles and prevention of soaring up of particles and shortening of a restoration time from the depressurized state of the chamber to the atmospheric state.

What is claimed is:

1. A break filter, comprising a silicon carbide porous body comprising:
    a skeletal structure formed by a plurality of silicon carbide particles bonded to each other;
    a plurality of pores formed by the skeletal structure; and
    neck parts formed by surface-contacting of adjacent silicon carbide particles,
    wherein
    an average pore size is larger than 3 μm and equal to or smaller than 9 μm and
    a porosity of the silicon carbide porous body ranges from 35% to 55%,
    wherein the break filter is placed at a gas inlet of a semiconductor processing apparatus.

2. A method of manufacturing a break filter comprising a filter element made by forming a silicon carbide porous body to a disk shape, a casing made of passivation-treated stainless steel that covers a first side of the filter element and is provided with a gas inlet for introducing gas on the first side of the filter element, and a ring made of passivation-treated stainless steel that supports a periphery of a second side of the filter element and is fitted in the casing,
    the silicon carbide porous body comprising:
        a skeletal structure formed by a plurality of silicon carbide particles bonded to each other;
        a plurality of pores formed by the skeletal structure; and
        neck parts formed by surface-contacting of adjacent silicon carbide particles, wherein
        an average pore size is larger than 3 μm and equal to or smaller than 9 μm and
        a porosity of the silicon carbide porous body ranges from 35% to 55%,
    the method comprising steps of:
        cooling the ring;
        housing the filter element in the cooled ring; and
        integrating the ring to which the filter element is housed into the casing by cool-fitting.

* * * * *